(12) United States Patent
Maestle (10) Patent No.: US 8,508,237 B2
(45) Date of Patent: Aug. 13, 2013

(54) NETWORK ANALYZER CALIBRATOR HAVING ELECTRICAL AND ELECTROOPTICAL COMPONENTS

(75) Inventor: Ruediger Maestle, Boeblingen (DE)

(73) Assignee: Agilent Technologies, Inc., Santa Clara, CA (US)

( * ) Notice: Subject to any disclaimer, the term of this patent is extended or adjusted under 35 U.S.C. 154(b) by 411 days.

(21) Appl. No.: 12/004,213

(22) Filed: Dec. 20, 2007

(65) Prior Publication Data

US 2009/0160458 A1    Jun. 25, 2009

(51) Int. Cl.
*G01R 35/00*   (2006.01)

(52) U.S. Cl.
USPC ............................................ 324/601; 702/85

(58) Field of Classification Search
USPC .......................................... 324/601; 702/85
See application file for complete search history.

(56) References Cited

U.S. PATENT DOCUMENTS

| | | | | |
|---|---|---|---|---|
| 4,875,859 A * | 10/1989 | Wong et al. | .................... | 434/219 |
| 4,921,347 A * | 5/1990 | Wong et al. | ................. | 356/73.1 |
| 5,028,131 A * | 7/1991 | Dunsmore | .................... | 356/73.1 |
| 5,041,997 A * | 8/1991 | Hernday et al. | ............... | 702/121 |
| 5,175,492 A * | 12/1992 | Wong et al. | ...................... | 324/74 |
| 5,332,974 A * | 7/1994 | Harkins et al. | ................ | 324/606 |
| 5,548,538 A * | 8/1996 | Grace et al. | .................... | 324/605 |
| 5,552,714 A * | 9/1996 | Adamian et al. | ............... | 324/601 |
| 5,578,932 A * | 11/1996 | Adamian | ........................ | 324/601 |
| 5,715,183 A * | 2/1998 | Grace et al. | .................... | 324/605 |
| 6,066,953 A * | 5/2000 | Wadell | .......................... | 324/601 |
| 6,417,674 B1 * | 7/2002 | Rowell et al. | ................. | 324/601 |
| 2007/0280704 A1 * | 12/2007 | Fitzgerald et al. | ............ | 398/198 |

* cited by examiner

*Primary Examiner* — Arleen M Vazquez (57) ABSTRACT

A calibration kit (100) for calibrating a connectable network analyzer (102), including a converter (104, 106) adapted for performing a conversion between an electrical signal and an optical signal, a calibration standard (108, 110) for calibrating the network analyzer (102), and a switch array (112) adapted for switching the converter (104, 106) and the calibration standard (108, 110) in a manner to enable an electrical calibration of the network analyzer (102) and a calibration of the converter (104, 106) coupled to the network analyzer (102).

24 Claims, 5 Drawing Sheets

NETWORK ANALYZER CALIBRATOR HAVING ELECTRICAL AND ELECTROOPTICAL COMPONENTS

BACKGROUND

The present invention relates to the calibration of test devices for testing devices under test (DUT).

For testing electronic devices as DUTs using a network analyzer as a test device, in particular for testing integrated electronic circuits providing digital electrical output signals, a test or stimulus signal is fed to an input of the device under test, and a response signal of the device under test is evaluated by an automatic test equipment, for example by comparison with expected data.

A corresponding test device or network analyzer is an instrument used to analyze the properties of electrical networks, especially those properties associated with the reflection and transmission of electrical signals known as scattering parameters (S-parameters). To ensure accuracy of a network analyzer, a network analyzer has to be calibrated before use.

U.S. Pat. No. 4,921,347 discloses that in a method and an apparatus for calibrating absolute and relative measurements of modulation and/or demodulation transfer characteristics of electro-optical and opto-electrical devices during setup of a lightwave component measurement system for characterizing performance of fiber optic systems and associated components, an initial calibration reference is established based on the known characteristics of a lightwave source and lightwave receiver included in the lightwave component measurement system. A measurement is then performed on the calibration reference (the lightwave source or the lightwave receiver), and error correction data are produced and stored in a lightwave component analyzer included in the lightwave component measurement system. The modulation (or demodulation) transfer characteristics are preferably given in terms of the responsivity magnitude and phase versus modulation frequency. A device under test (DUT) then is measured when it replaces its calibrated counterpart in the measurement setup. The lightwave component analyzer uses the error correction data when the E/O or O/E characteristics of the DUT are measured.

U.S. Pat. No. 5,175,492 discloses another calibration system for calibrating a network analyzer.

However, conventional calibration systems for network analyzers may lack sufficient functionality.

DISCLOSURE

It is an object of the invention to provide a calibration system for a network analyzer having an improved performance and usability. The object is solved by the independent claims. Further embodiments are shown by the dependent claims.

According to an exemplary embodiment, a calibration kit (for instance a calibration module detachably connectable to a network analyzer under calibration) for calibrating a connectable network analyzer (such as a test device for testing devices under test) is provided, the calibration kit comprising at least one converter (such as an optoelectronic transceiver) adapted for performing a conversion between an electrical signal (such as an analog or a digital current or voltage signal) and an optical signal (such as an analog or a digital electromagnetic radiation signal), at least one calibration standard for calibrating the network analyzer, and a switch array (such as an arrangement of a plurality of switches which are interconnected to allow for a selective adjustment of active and passive pathes in an electric network) adapted for switching the at least one converter and the at least one calibration standard in a manner to enable an electrical calibration of the network analyzer and a calibration (or alternatively an activation) of the converter coupled to the network analyzer.

According to another exemplary embodiment, a network analyzer system is provided, the network analyzer system comprising a network analyzer adapted for analyzing a connectable device under test (DUT) and a calibration kit having the above mentioned features for calibrating the network analyzer.

According to still another exemplary embodiment, a method of calibrating a network analyzer is provided, the method comprising connecting a calibration kit to the network analyzer, and switching at least one converter of the calibration kit for performing a conversion between an electrical signal and an optical signal and switching at least one calibration standard of the calibration kit for calibrating the network analyzer in a manner to enable an electrical calibration of the network analyzer and a calibration of the converter coupled to the network analyzer.

According to still another exemplary embodiment, a software program or product is provided, preferably stored on a data carrier, for controlling or executing the method having the above mentioned features, when run on a data processing system, such as a computer.

Embodiments of the invention can be partly or entirely embodied or supported by one or more suitable software programs, which can be stored on or otherwise provided by any kind of data carrier, and which might be executed in or by any suitable data processing unit. Software programs or routines can be preferably applied in the context of calibration systems. The calibration system control scheme according to an embodiment of the invention can be performed or assisted by a computer program, i.e. by software, or by using one or more special electronic optimization circuits, i.e. in hardware, or in hybrid form, i.e. by means of software components and hardware components.

According to an exemplary embodiment, a calibration system for calibrating a network analyzer is provided in which in addition to calibration standards, a converter can be selectively switched into an active part to allow the introduction of an electro-optical/optoelectrical conversion to be introduced into the calibration procedure or to be provided as an additional function of the system. Thus, calibration of a network analyzer may be made possible, adapted for an optical measurement/function. An electrically operating network analyzer in combination with an optical calibration or conversion unit may allow to provide a unified measurement standard for electrical and optical calibration, thereby ensuring that different calibration sections fit to one another. Therefore, a calibration kit for a network analyzer is provided having electrical and optical calibration standards. An electric reference for the calibration of optoelectronic components may be provided. More particularly, a calibration kit for a network analyzer may be provided having one or more converters between an optical and an electrical signal and one or more electric calibration standards, wherein functions of these components are combinable by switching them in such a manner that electrical and electro-optical calibrations may be performed. This may allow to increase the ease of use and a comfort for a user, and the apparatus may be less prone to failure. Furthermore, the effort for providing and removing screwed connections using RF cables for performing the calibration may be reduced. A dynamometric key/torque spanner which may be required for providing a connection with reproducible properties may be dispensable according to exemplary embodiments. By integrating optical and electrically components into the calibration kit, the discrepancy between electrical and optical systems may be reduced. Therefore, a calibration kit may be provided which supports electrical and optical calibration.

Next, further exemplary embodiments of the calibration kit will be explained. However, these embodiment also apply to the network analyzer system, to the method of calibrating a network analyzer and to the software program or product.

The converter may comprise an optoelectronic conversion unit adapted for converting an optical signal into an electrical signal. Such an optoelectronic conversion unit may be a receiver unit having an input at which an optical signal is provided and having an output at which an electrical signal is providable. Additionally or alternatively, the calibration kit may comprise an electrooptical conversion unit adapted for converting an electrical signal into an optical signal. Such an electrooptical conversion unit may be a transmitter having an input at which an electrical signal is provided and having an output at which an optical signal may be providable.

Thus, a unidirectional or bidirectional conversion of an electrical signal into an optical signal, or vice versa, may be provided.

The calibration standard may comprise at least one electrical calibration standard. Such an electrical calibration standard may include a "thru" or transmission standard having two ports, namely an input port and an output port and guiding an input signal provided at the input port towards an output signal provided at the output port. A reflection standard is an example for an electrical calibration standard and may have only one port, reflecting an incoming signal to propagate in a backwards direction.

It is possible that the calibration standards not only comprise electrical calibration standards, but may also comprise at least one optical calibration standard. Thus, the flexibility of use may be further increased.

The switch unit may comprise a network of a plurality of switch units each adapted for being switched individually to mutually define an active signal path including activating at least one of the at least one converter and at least one of the at least one calibration standard at a time. For example, each of the switch units may be realized via a transistor such as a FET, wherein controlling the gate voltage defines whether or not a current can be conducted between source and drain. The individual switch units may be centrally controlled by a control unit operating the switches in accordance with a specific calibration scheme. For instance, at a first time, one specific component (for instance a calibration standard or a converter) may be activated, and at a subsequent point of time this component may be deactivated. Therefore, it is possible to bring a complex network of converters and calibration standards into any desired operation mode, in accordance with a desired function.

A network analyzer interface may be provided for connecting a network analyzer to the calibration kit. Such a network analyzer interface may be an electrical interface such as a connector, a jack or a plug. Therefore, via the network analyzer interface, electrical signals may be exchanged between calibration kit and the network analyzer in the context of the calibration procedure. By connecting different calibration standards one after the other or in a groupwise manner with the network analyzer, and by detecting response signals resulting from an application of stimulus signals to the system, calibration parameters/components of an error matrix may be derived as a result of a calibration procedure.

In addition to the network analyzer interface, the calibration kit may comprise a device under test interface adapted for connecting a device under test (DUT) to the calibration kit. Both the network analyzer interface and the device under test interface may comprise two connectors to selectively connect a device under test. For instance, a device under test may be connected between the two device under test interfaces of the calibration kit. Alternatively, it is also possible to switch the device under test between one connection of a network analyzer and one connection of a calibration kit, or between two connections of a network analyzer. At least one of the device under test interfaces may comprise an optical interface, thereby allowing to supply an optical signal to the device under test or to receive an optical signal from the device under test. It is also possible that at least one of the device under test interfaces comprises an electrical interface to allow to supply an electrical signal to the device under test or to receive an electrical signal from the device under test.

The network analyzer interface and the device under test interface may be arranged so that at least one of the at least one converter is connectable between the network analyzer interface and the device under test interface by correspondingly switching the switch array. Therefore, the device under test may be coupled to optoelectronic components, whereby allowing to also couple optoelectronic devices under test to the system.

A surrounding casing may be provided in which the at least one converter, the at least one calibration standard and the switch array are accommodated. Therefore, the calibration kit may be configured as a "black box" or as an autarkic apparatus having only some external connections and allowing an intuitive use by a user. The calibration kit may be provided as a single unit, or may be integrally formed with all components being positioned within the casing or housing.

Alternatively, the calibration kit may comprise a surrounding casing in which the calibration standard and a part of the switch array (i.e. some of the switches thereof) are accommodated, whereas the converter and another part of the switch array (i.e. some other of the or even all remaining switches) are accommodated outside of the surrounding casing. Such a configuration may be used to retrofit an existing calibration kit with an externally added converter function.

A control unit may be provided and adapted for switching the switch units of the switch array and for connecting the network analyzer to the calibration kit in accordance with a predefined calibration scheme. Such a control unit may comprise processing capabilities adapted for carrying out a specific calibration sequence. Such a calibration sequence may also be stored in a memory unit (such as an EEPROM) coupled to the control unit. Thus, when being connected to a network analyzer, the system may automatically (or upon receipt of an instruction command of a user) trigger calibration of the network analyzer, supporting electrical and optical as well as electrooptical components.

In following, further exemplary embodiments of the network analyzer system will be explained. However, these embodiments also apply to the calibration kit, to the method of calibrating a network analyzer and to the software program or product.

The network analyzer system may be adapted to test at least one device under test of the group consisting of an electrooptical device under test and an optoelectronic device under test. Thus, various devices under test may be connected to the network analyzer system which may provide a capability of processing electrical and/or optical signals, performing a corresponding conversion, etc. Hence, embodiments of the invention may be implemented in the context of photonics or optoelectronics, i.e. the application of electronic devices that are interrelated with electromagnetic radiations such as light.

Implementable optoelectronic devices are electrical to optical or optical to electrical transducers. Applications of optoelectronics may be based on quantum mechanical effects of light or semiconducting materials. For example, diodes, phototransistors, photomultipliers, integrated optical circuits, photoresistors, photoconductive camera tubes, charge coupled imaging devices, stimulated emission units such as lasers or laser diodes, light emitting diodes, photo emissive camera tubes, optocouplers, or optical fibre communication components may be examples.

The network analyzer may comprise a storage unit (such as an EEPROM) adapted for storing calibration data obtained as a calibration result of a calibration of the network analyzer and/or the converter of the calibration kit.

The network analyzer may be adapted for testing at least one device under test of the group consisting of an optoelectronic component, a transceiver, an optoelectronic converter, an optical member, an optical transmitter, and an optical transceiver. However, other embodiments or applications are possible.

When testing electrooptical or optoelectronic members (for instance transmitters or receivers), it is possible to measure a frequency dependency of a response function of a frequency dependent stimulus signal. When using a purely electrically operating network analyzer, the provision of electrooptical converters or optoelectrical converters allows also the implementation of electrooptical devices under test having an electrical interface and an optical interface. In order to cover such various electrooptical devices under tests, a receiver and/or a transmitter unit may be integrated within a calibration kit. When calibrating a network analyzer (which in many cases is not stable in the long term and therefore may require re-calibration several times over its lifetime), a calibration kit may be connected temporarily to determine calibration parameters which may be stored in the network analyzer and/or in the calibration kit. In contrast to this, electrooptical components such as a receiver or a transmitter can in many cases be calibrated one time in a factory and may remain stable over a long time. For the electrical calibration of a network analyzer, it may be appropriate to make use of reflection standards and/or transmission standards.

According to an exemplary embodiment, an automatic calibration entity may be provided which can be considered as a black box in which calibration standards are accommodated which may be subsequently connected to dedicated network analyzer ports. During the calibration, it is possible to perform calculations and to store resulting calibration data in the network analyzer. Such a calibration may compensate network analyzer internal inaccuracies and errors. However, errors regarding electrical references also have an influence on optical references. Exemplary embodiments may allow to combine electrical and electrooptical references.

A corresponding procedure may include two steps. In a first step, a network analyzer may be connected to a calibration unit to perform an electrical calibration. In a second step, the network analyzer may remain connected to the calibration kit, and a device under test may be connected between the network analyzer and an optoelectrical/electrooptical converter of the calibration kit. This may be performed by switching switch units within the calibration kit.

A calibration procedure which may be implemented according to exemplary embodiments is described in U.S. Pat. No. 5,175,492, which, in its entirety, is herewith incorporated by reference into the present application.

BRIEF DESCRIPTION OF DRAWINGS

Other objects and many of the attendant advantages of embodiments of the present invention will be readily appreciated and become better understood by reference to the following more detailed description of embodiments in connection with the accompanied drawings. Features that are substantially or functionally equal or similar will be referred to by the same reference signs.

The illustration in the drawing is schematically.

Figure 1:
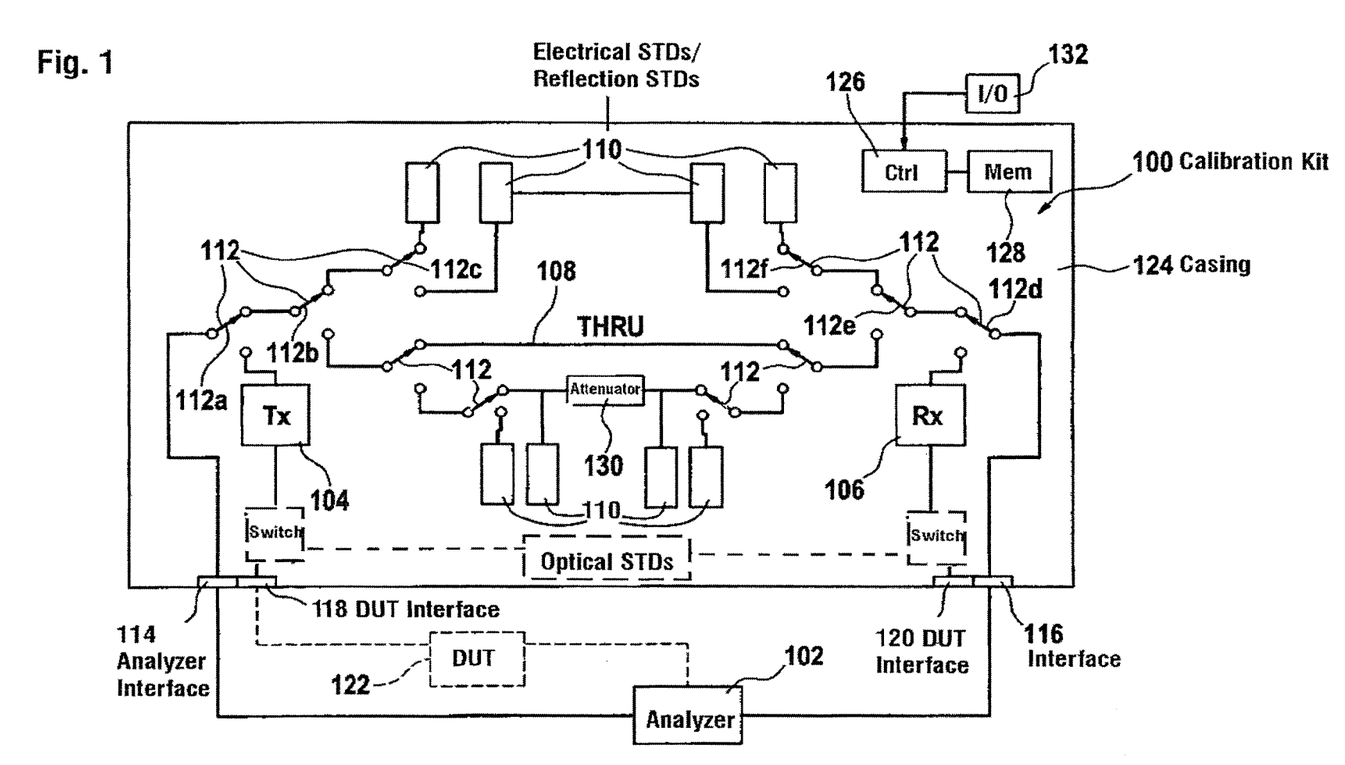
FIG. 1 to FIG. 4 illustrate network analyzing systems according to exemplary embodiments in different operation modes.

FIG. 1 illustrates a network analyzer system according to an exemplary embodiment.

Figure 5:
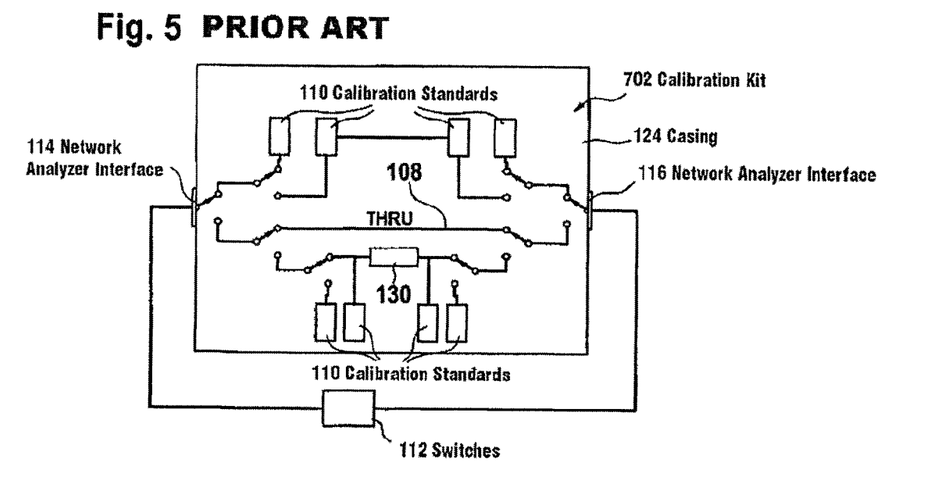
FIG. 5 illustrates a conventional network analyzer system.

For comparison with the network analyzer system shown in FIG. 1 according to an exemplary embodiment, FIG. 5 shows a conventional electronic calibration kit 702.

The network analyzer system of FIG. 1 comprises a network analyzer 102 adapted for analyzing a connectable device under test 122 (DUT). Furthermore, the network analyzer system of FIG. 1 comprises a calibration kit 100 for calibrating the network analyzer 102 which will be explained below in more detail.

The calibration kit 100 comprises an electrooptical conversion unit 104 (Tx) adapted for converting an electrical signal into an optical signal. Further, the calibration kit 100 comprises an optoelectronic conversion unit 106 (Rx) adapted for converted an optical signal into an electrical signal.

Moreover, the calibration kit 100 comprises a number of electrical calibration standards, namely a plurality of reflection standards 110 (Z1, Z2, Z3, Z4) and one transmission standard 108 (THRU). Furthermore, an attenuator unit 130 (ATTN) is foreseen.

Beyond this, a switch array 112 is provided which is adapted for switching the converters 104, 106 and the calibration standards 108, 110 into active paths for activating them, or out of the active paths for deactivating them. The switching may be performed in a manner to enable an electrical calibration of the network analyzer 102, and optionally a calibration of the converters 104, 106 couplable to the network analyzer 102.

In the operation mode shown in FIG. 1, an active path is formed from the network analyzer 102, via a switch 112a, a switch 112b, a switch 112c, to one of the reflection standards 110 (Z2). An active path is further formed from the network analyzer 102, via a switch 112d, a switch 112e, a switch 112f, to another one of the reflection standards 110 (Z2). In the operation mode shown in FIG. 1, the converters 104, 106 are not activated, such an activation would require to actuate one of the switches 112a, 112d.

The switch array 112 is formed by a plurality of discrete FET (field effect transistor) switches which can be operated centrally and individually by a control unit 126 which may be a central processing unit (CPU). More specifically, the control unit 126 is capable of applying specific control voltages to the gate terminals of the FET switches 112 to thereby selectively close or open individual ones of the switches 112. Therefore, active and passive paths may be defined, for example to couple a specific number of calibration standards 108, 110 to the network analyzer 102, in accordance with a predefined (or user-definable) calibration scheme. When an electrooptical/optoelectrical conversion is required, for instance when the DUT 122 is connected to the calibration kit 100 and/or to the network analyzer 102, one of the converters 104, 106 or even both converters 104, 106 can be activated.

A first electrical network analyzer interface 114 and a second electrical network analyzer interface 116 are provided and adapted for electrically connecting a network analyzer 102 to the calibration kit 100. This coupling can be realized via a plug-socket connection. Moreover, a first device under test interface 118 and a second device under test interface 120 are provided at the calibration kit 100 allowing to selectively connect the device under test 122. In the embodiment of FIG. 1, the network analyzer 102 is connected with the two network analyzer interfaces 114, 116, whereas a DUT 122 is indicated with dotted lines to be connectable between the device under test interface 118 and the network analyzer 102.

A surrounding closed casing 124 is provided within which the converters 104, 106, the calibration standards 108, 110 and the switch array 112 are accommodated. Furthermore, the control unit 126 and a memory unit 128 are also included within the casing 124, thereby providing a self-sufficient or autarkic calibration kit 100 which can be considered as a black box having only the external interfaces 114, 116, 118, 120 and a connection to an input/output unit 132. The input/output unit 132 comprises input elements such as a keypad, buttons, a joystick, etc. Furthermore, the input/output unit 132 comprises a display unit such as an LCD device or a cathode ray tube allowing a user to monitor or control the calibration procedure.

The control unit 126 is adapted for switching the switch array 112 and for connecting the network analyzer 102 to the calibration kit 110 in accordance with a predefined calibration scheme. Thus, the difference sequences in a context of a calibration procedure may be triggered, controlled or regulated by the control unit 126. Also the temporary connection or disconnection of the converters 104, 106 to the device under test 122 may be controlled by the control unit 126.

The device under test 122 may be an electrooptical device or an optoelectrical device.

FIG. 1 shows an integrated electrooptical reference system, having a switch configuration. Providing two switches 112a, 112d effecting an optical reference receiver 106 and an optical reference transmitter 104, respectively, adds a light wave component analyzer (LCA) function to the calibration kit 110. In other words, exemplary embodiments provide a calibration kit extended by an electrooptical function.

Four reflection standards 110 are provided for least square determination of reflection error terms. Furthermore, one calibrated reciprocal "thru" transmission standard 108 for use as "defined thru" or "unknown thru" is provided for the determination of transmission error terms. The reference receiver 106 and the reference transmitter 104 are provided for LCA functionality.

Optionally, it is possible to replace the reciprocal "thru" by light wave component analyzer Rx and Tx for non-reciprocal "thru". For this, an additional optical switch might be incorporated which allows switching from a direct connection between reference receiver 106 and the reference transmitter 104 to the device under test interfaces 118, 120. However, EE functionality then may require reversed reconnection or additional internal RF switches. It is possible to add the switches 112, particularly the switches 112a, 112d for operating the converters 104, 106 internally of the casing 124 (as shown in FIG. 1) or externally thereof.

The network analyzer interfaces 114, 116 may act as an electronic calibration kit (Ecal Kit) with characterization of these planes, whereas the device under test interfaces 118, 120 may serve as electrooptical calibration planes.

Figure 2:
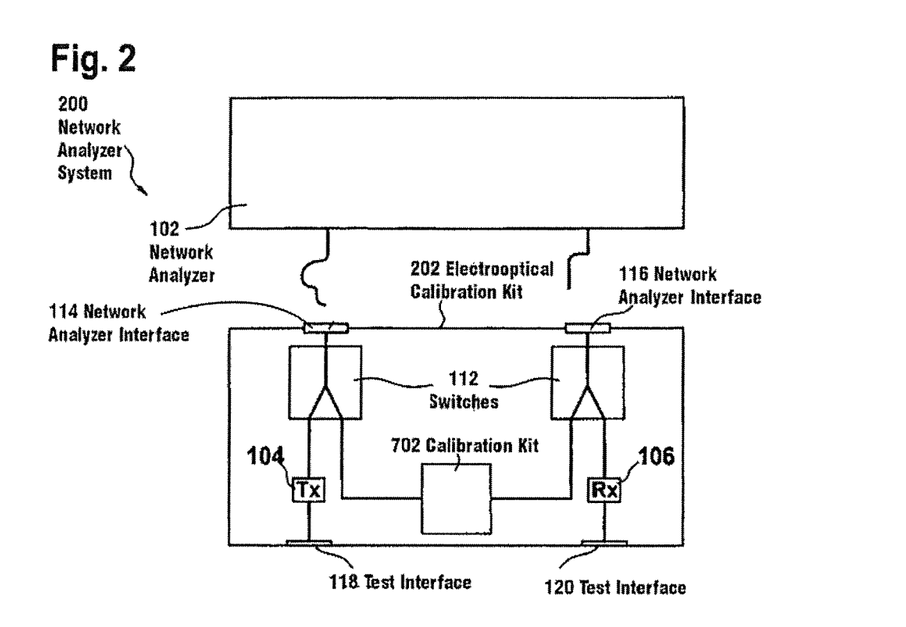

FIG. 2 shows a network analyzer system 200 having a network analyzer 102 (for instance a network analyzer of Agilent Technologies, such as a 872x, E8362A/B, or N5230A network analyzer) and a integrated electrooptical calibration kit 202. The calibration kit 202 comprises a conventional electronic calibration kit 702 (a collection of electrical standards operated via a switch array) as shown in FIG. 5 and additionally comprises the converters 104, 106 which are located outside of the casing of the electronic calibration kit 702. Also the switches 112 are partially provided outside of the casing of the electronic calibration kit 702.

Therefore, the embodiment of FIG. 2 comprises an electronic calibration kit 702 of Agilent Technologies and additionally comprises external SPDT switches 112. Optionally, it is possible to add additional FET switches into the electronic calibration kit 702. The calibration kit 202 may be denoted as a light wave component analyzer (LCA) box.

Figure 3:
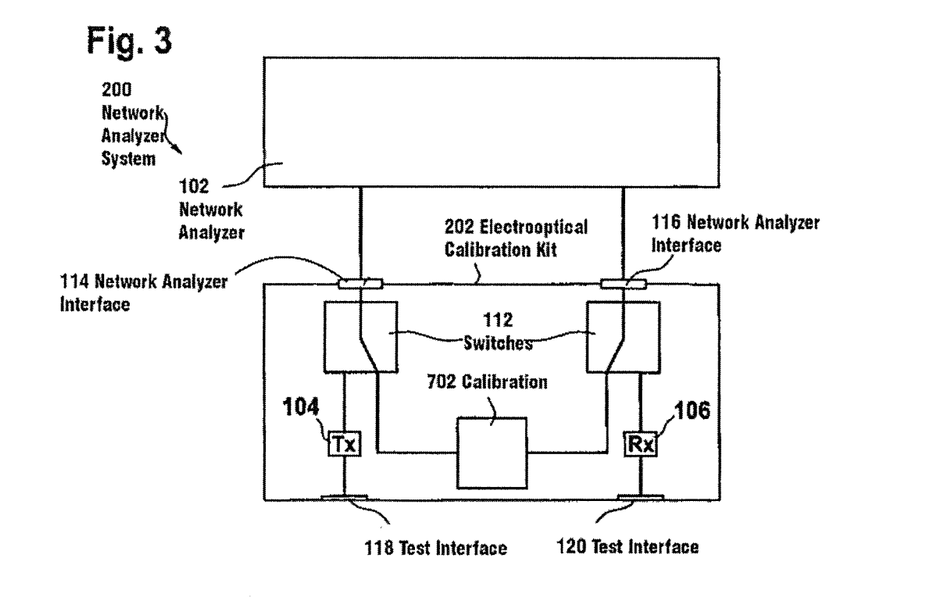

FIG. 3 shows the network analyzer system 200 in an operation state in which the switches 112 are set appropriately so that the LCA box 202 simply acts as an electronic calibration kit (that is to say only the function of the entity 702 is activated). Electrical calibration planes 300, 302 for connection of the calibration kit 202 to the network analyzer 102 are shown as well. To activate the converters 104 or 106, one of the switches 112 shown in FIG. 3 would have to be actuated.

Figure 4:
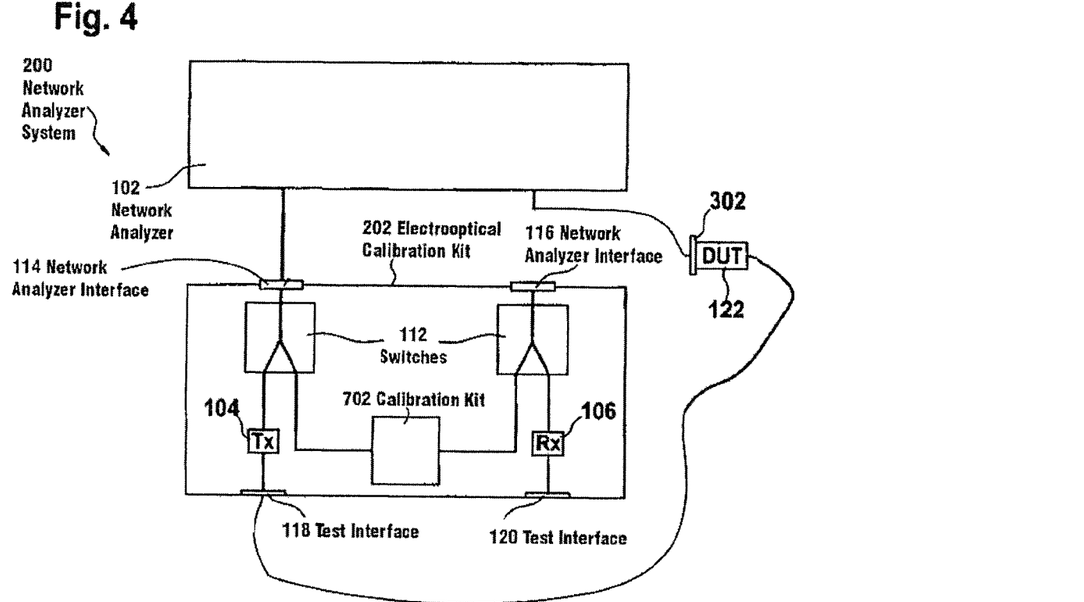

In the operation state of FIG. 4, the network analyzer system 200 is brought into an operation state in which the switches 112 are set appropriately that the LCA box 202 simply acts as an LCA. In this example case, an OE measurements is shown. Therefore, one connection of the network analyzer 102 is connected to a device under test 122, in the configuration of FIG. 4.

From a comparison of FIG. 3 and FIG. 4, advantages of the proposed integrated electro-optical reference become apparent. In a first step the network analyzer 102 is electrically calibrated in the configuration according to FIG. 3. In the second step the DUT 122 is tested. As an example the test of an opto-electrical converting DUT 122 is shown in FIG. 4. Only one electrical calibration and only three electrical connections for an electrooptical (EO) or optoelectrical (OE) measurement are sufficient. Therefore, less wear on connectors (less connections) and thus less degradation occurs. Additionally, such a system has even lower sensitivity to connector degradation.

Furthermore, a high operational availability is possible. Onsite repair and recalibration of damaged connectors may be possible via an exchange of damaged connectors, and the use of the known good electronic calibration kit 702 to remeasure the internal electrical standards is possible.

The system is easily adaptable to any network analyzer via a connector adapter.

Furthermore, the performance of the calibration system may be improved. Electrooptical calibration is made with a reference to electronic calibration kit, and now the same electronic calibration kit may be used in a factory during deriviation of calibration data for the reference transmitter 104 and reference receiver 106 and at the customer side for performing DUT measurements.

Figure 6:
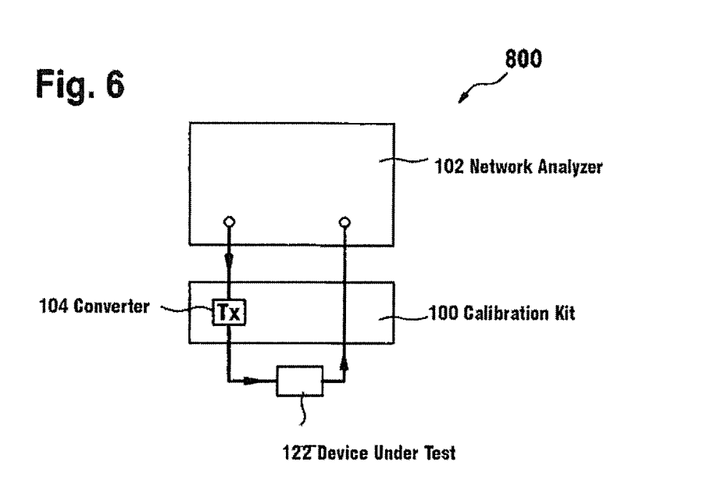
FIG. 6 to FIG. 8 illustrate different configurations between network analyzers, calibration kits and devices under test according to exemplary embodiments.

FIG. 6 shows a configuration for testing a opto-electrical DUT in which a network analyzer 102 is connected with the calibration kit 100, and a device under test 120 is connected as well. An electrical signal is supplied from the network analyzer 102 to the converter 104 which converts the signal into an optical signal for input into the device under test 122. The device under test 122 converts the optical signal back into an electrical signal which is supplied back to the network analyzer 102.

Figure 7:
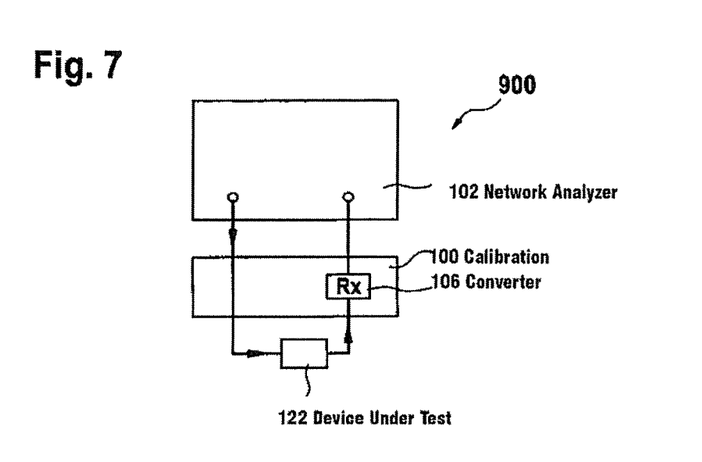

FIG. 7 shows another scenario for testing a electro-optical DUT in which an electrical signal is input into the device under test 122. The device under test 122 converts this electrical signal into an optical signal which is supplied to a converter 106 in the calibration kit 100, converting the optical signal back to an electrical signal which is then supplied to the network analyzer 102.

Figure 8:
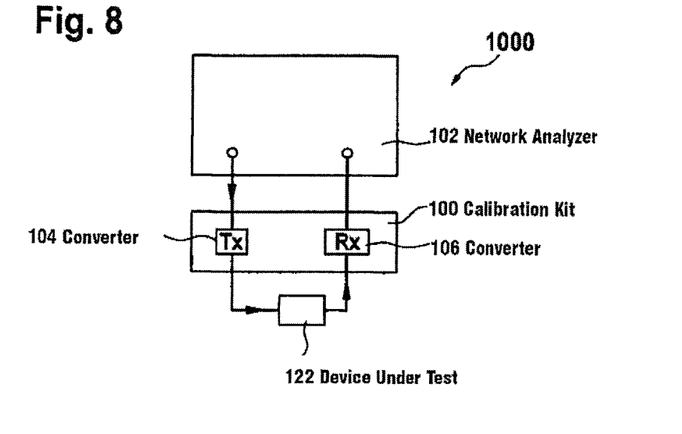

FIG. 8 shows a scenario 1000 for testing a optical-optical DUT in which an electrical signal is supplied from the network analyzer 102 to the converter 104 for converting this electrical signal into an optical signal for supply to an input of the device under test 122. The device under test 122 outputs an optical signal for supply to the further converter 106, converting this optical signal back into an electrical signal. This electrical signal is supplied to the network analyzer 102. In the latter embodiment, the device under test 122 may be, for instance, an optical fibre without electrical capabilities.

It should be noted that the term "comprising" does not exclude other elements or features and the "a" or "an" does not exclude a plurality. Also elements described in association with different embodiments may be combined. It should also be noted that reference signs in the claims shall not be construed as limiting the scope of the claims.

The invention claimed is:

1. A calibration kit for calibrating a connectable network analyzer, the calibration kit comprising:
a converter configured for performing a conversion between an electrical signal and an optical signal;
a calibration standard configured for calibrating the network analyzer;
a switch array configured for switching the converter and the calibration standard into active paths, respectively, to selectively enable an electrical calibration of the network analyzer via a network analyzer interface and calibration of the converter; and
an optical switch configured for switching a direct connection between the converter and a device under test via a device under test interface.

2. The calibration kit of claim 1, wherein the converter comprises an optoelectronic conversion unit configured for converting an optical signal into an electrical signal.

3. The calibration kit of claim 1, wherein the converter comprises an electrooptical conversion unit configured for converting an electrical signal into an optical signal.

4. The calibration kit of claim 1, wherein the converter comprises an optoelectronic conversion unit configured for converting an optical signal into an electrical signal and comprises an electrooptical conversion unit configured for converting an electrical signal into an optical signal.

5. The calibration kit of claim 1, wherein the calibration standard comprises at least one electrical calibration standard.

6. The calibration kit of claim 5, wherein the calibration standard comprises at least one optical calibration standard.

7. The calibration kit of claim 1, wherein the calibration standard comprises at least one reflection standard.

8. The calibration kit of claim 1, wherein the calibration standard comprises at least one transmission standard.

9. The calibration kit of claim 1, wherein the switch array comprises a network of switch units configured for being switched to define an active signal path including activating at a time one of the converter and the calibration standard.

10. The calibration kit of claim 1, wherein the network analyzer interface is configured for connecting the network analyzer to the calibration kit.

11. The calibration kit of claim 10, wherein the network analyzer interface is an electrical interface.

12. The calibration kit of claim 10, wherein the device under test interface is configured for connecting the device under test to the calibration kit.

13. The calibration kit of claim 12, wherein the device under test interface comprises at least one of an electrical interface and an optical interface.

14. The calibration kit of claim 12, wherein the network analyzer interface and the device under test interface are arranged so that the converter is coupleable between the network analyzer interface and the device under test interface by switching the switch array.

15. The calibration kit of claim 1, further comprising:
a surrounding casing containing the converter, the calibration standard, the switch array and the optical switch.

16. The calibration kit of claim 1, further comprising:
a surrounding casing containing the calibration standard and a part of the switch array, wherein the converter and another part of the switch array are accommodated outside of the surrounding casing.

17. The calibration kit of claim 1, further comprising:
a control unit configured for controlling switching of the switch array and controlling connecting the network analyzer to the calibration kit in accordance with a predefined calibration scheme.

18. The calibration kit of claim 1, configured as an autarkic apparatus.

19. A network analyzer system, the network analyzer system comprising:
the network analyzer configured for analyzing a connectable device under test; and
a calibration kit of claim 1 for calibrating the network analyzer.

20. The network analyzer system of claim 19, configured to test at least one device under test of the group consisting of an electrooptical device under test and an optoelectrical device under test.

21. The network analyzer system of claim 19, wherein the network analyzer comprises a storage unit configured for storing calibration data indicative of a calibration result of at least one of the group consisting of the network analyzer and the converter of the calibration kit.

22. The network analyzer system of claim 19, wherein the network analyzer is configured for testing at least one device under test of the group consisting of an optoelectronic component, a transceiver, an optoelectronic converter, an optical member, an optical transmitter, and an optical receiver.

23. A method of calibrating a network analyzer, the method comprising:
connecting a calibration kit to the network analyzer;
switching a converter of the calibration kit for performing a conversion between an electrical signal and an optical signal;
switching a calibration standard of the calibration kit for calibrating the network analyzer via a network analyzer interface to selectively enable using the calibration standard for an electrical calibration of the network analyzer and calibration of the converter; and
selectively coupling a device under test between the converter via a device under test interface and the network analyzer for testing the device under test.

24. A software program or product, embodied on a non-transitory computer readable medium, for controlling or executing the method of claim 23, when run on a data processing system.

* * * * *